(12) United States Patent
Kopp et al.

(10) Patent No.: US 10,374,126 B2
(45) Date of Patent: Aug. 6, 2019

(54) OPTOELECTRONIC SEMICONDUCTOR CHIP AND METHOD FOR FABRICATING AN OPTOELECTRONIC SEMICONDUCTOR CHIP

(71) Applicant: OSRAM Opto Semiconductors GmbH, Regensburg (DE)

(72) Inventors: Fabian Kopp, Penang (MY); Sebastian Taeger, Bad Abbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/763,828

(22) PCT Filed: Oct. 12, 2016

(86) PCT No.: PCT/EP2016/074445
§ 371 (c)(1),
(2) Date: Mar. 27, 2018

(87) PCT Pub. No.: WO2017/064112
PCT Pub. Date: Apr. 20, 2017

(65) Prior Publication Data
US 2018/0358510 A1    Dec. 13, 2018

(30) Foreign Application Priority Data
Oct. 16, 2015  (DE) .................. 10 2015 117 662

(51) Int. Cl.
*H01L 33/24*   (2010.01)
*H01L 33/32*   (2010.01)
(Continued)

(52) U.S. Cl.
CPC .......... *H01L 33/24* (2013.01); *H01L 33/0062* (2013.01); *H01L 33/0075* (2013.01);
(Continued)

(58) Field of Classification Search
None
See application file for complete search history.

(56) References Cited

U.S. PATENT DOCUMENTS

2006/0017061 A1   1/2006  Sakamoto et al.
2006/0231852 A1  10/2006  Kususe et al.
(Continued)

FOREIGN PATENT DOCUMENTS

JP       5301418 B2    9/2013
WO    02/13281 A1    2/2002

*Primary Examiner* — Fernando L Toledo
*Assistant Examiner* — Valerie N Newton
(74) *Attorney, Agent, or Firm* — McDermott Will & Emery LLP

(57) ABSTRACT

The invention relates to an optoelectronic semiconductor chip (100), comprising an n-doped semiconductor layer (3), a p-doped semiconductor layer (5) and an active layer (4) arranged between the n-doped semiconductor layer (3) and the p-doped semiconductor layer (5), wherein the p-doped semiconductor layer (5) has an electrically conductive layer (7) arranged above it that is set up for making electrical contact with the p-doped semiconductor layer (5), wherein a lateral edge (2) is arranged laterally with respect to the n-doped semiconductor layer (3), the p-doped semiconductor layer (5) and the active layer (4), wherein the lateral edge (2) has at least two oblique edge portions, wherein a first edge portion (21) has at least areas arranged laterally with respect to the p-doped semiconductor layer (5), wherein a second lateral edge (22) has at least areas arranged laterally with respect to the n-doped semiconductor layer (3), wherein the angle of the first edge portion (21) in relation to the active layer (4) is shallower than the angle of the second edge portion (22), and wherein the electrically conductive layer (7) is at a lateral distance from the lateral edge (2).

15 Claims, 7 Drawing Sheets

Figure 4A:
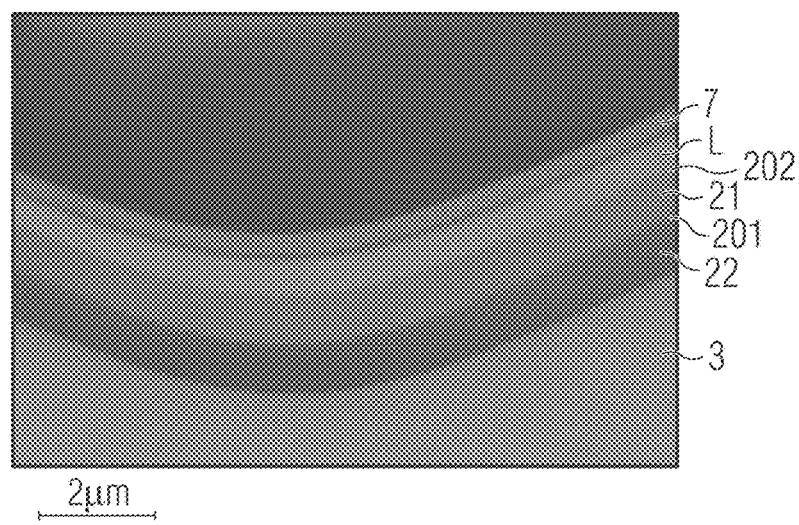

(51) Int. Cl.
*H01L 33/30* (2010.01)
*H01L 33/42* (2010.01)
*H01L 33/00* (2010.01)
*H01L 33/40* (2010.01)
*H01L 33/20* (2010.01)
*H01L 33/44* (2010.01)

(52) U.S. Cl.
CPC .............. *H01L 33/20* (2013.01); *H01L 33/30* (2013.01); *H01L 33/32* (2013.01); *H01L 33/405* (2013.01); *H01L 33/42* (2013.01); *H01L 33/005* (2013.01); *H01L 33/44* (2013.01); *H01L 2933/0016* (2013.01)

(56) References Cited

U.S. PATENT DOCUMENTS

| | | |
|---|---|---|
| 2009/0267100 A1 | 10/2009 | Miyake et al. |
| 2013/0210178 A1 | 8/2013 | Li et al. |
| 2014/0110744 A1 | 4/2014 | Wang et al. |
| 2014/0291612 A1 | 10/2014 | Aihara |
| 2014/0367717 A1 | 12/2014 | Freund et al. |
| 2015/0295131 A1 | 10/2015 | Saito |

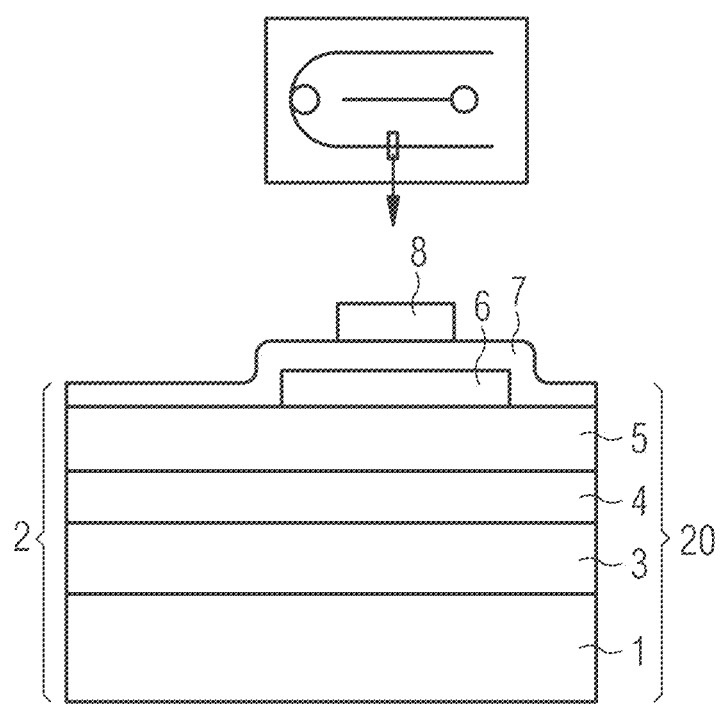

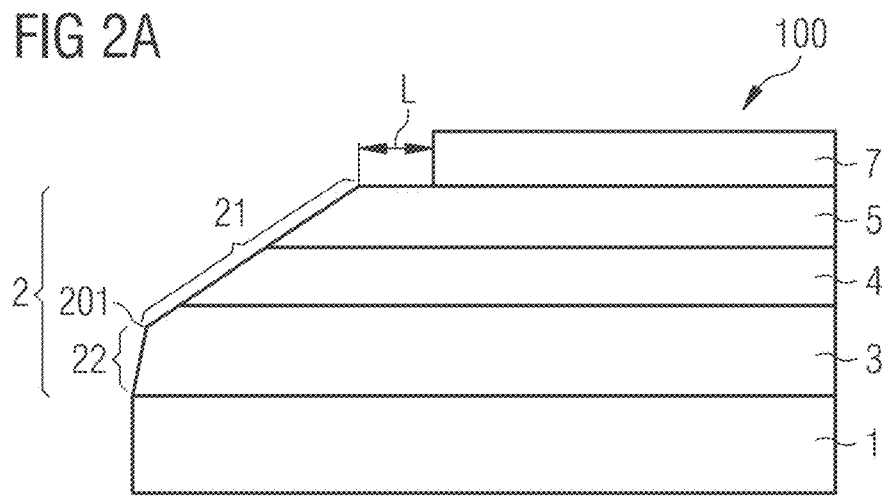
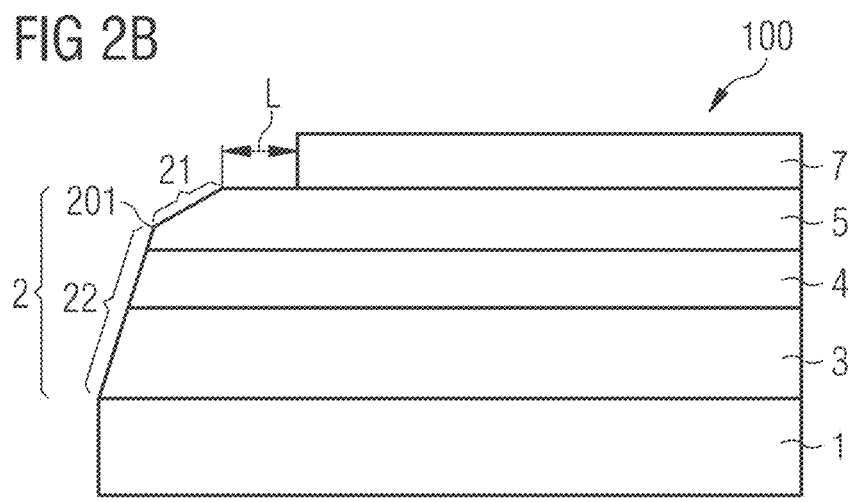
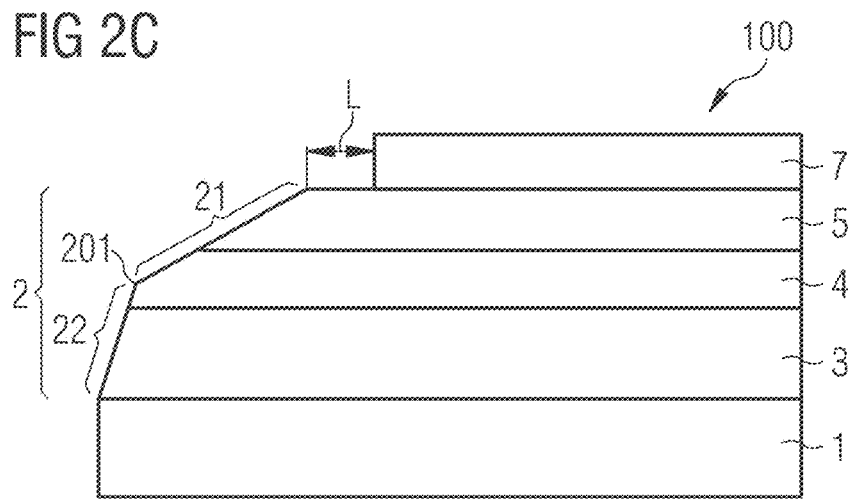

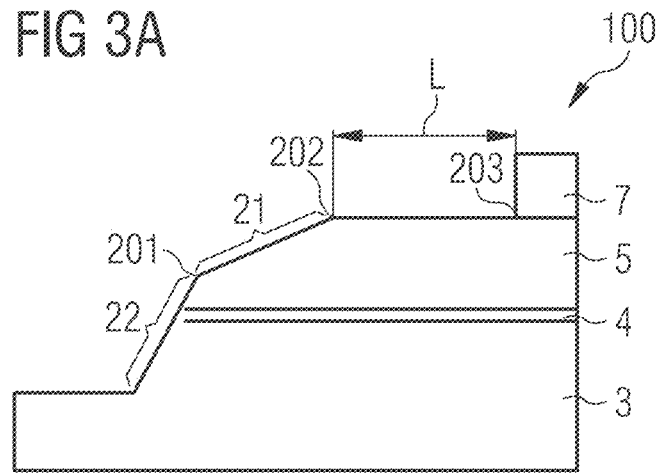
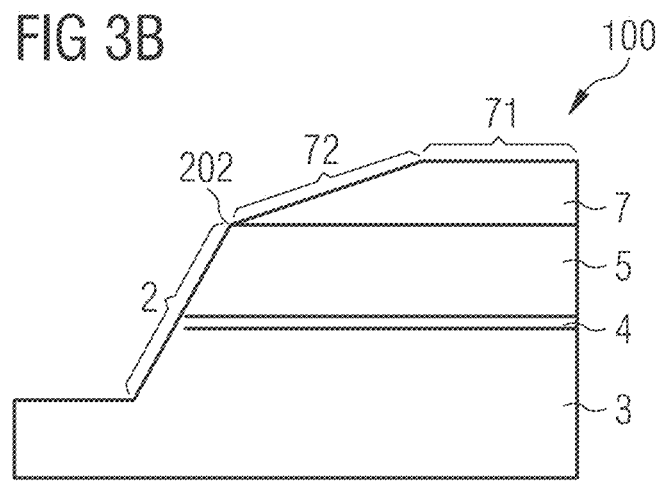
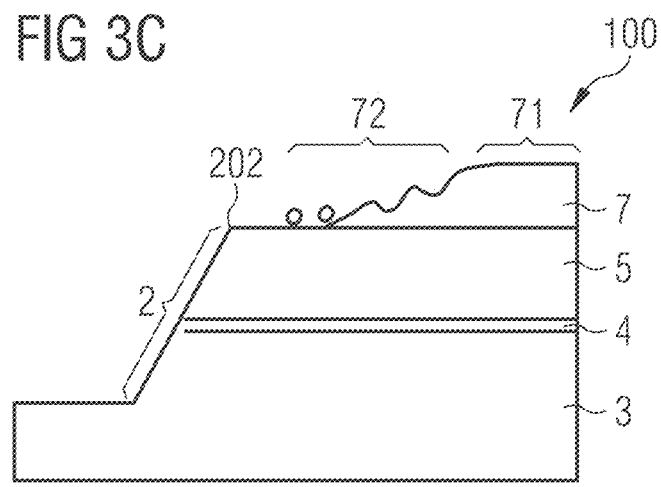

2μm

1μm

1μm

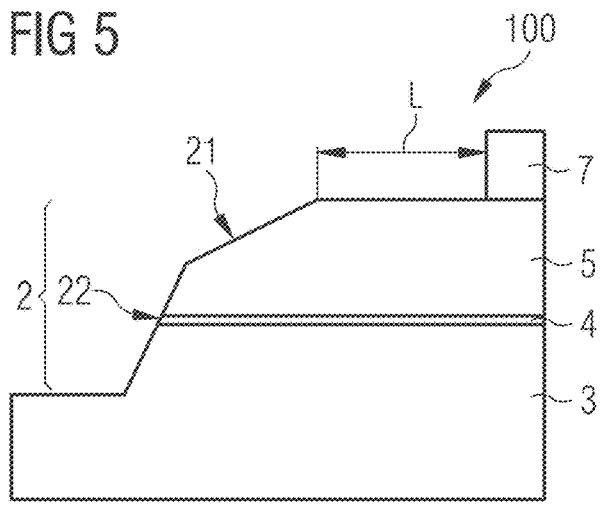
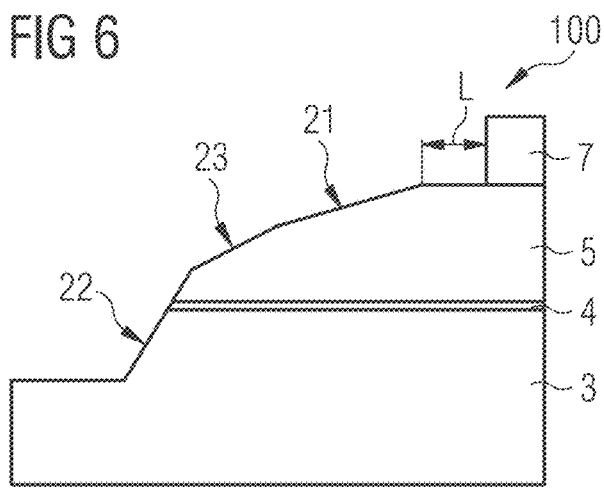
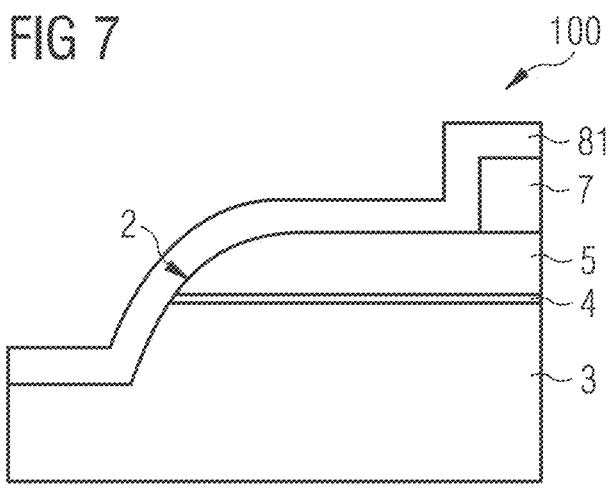

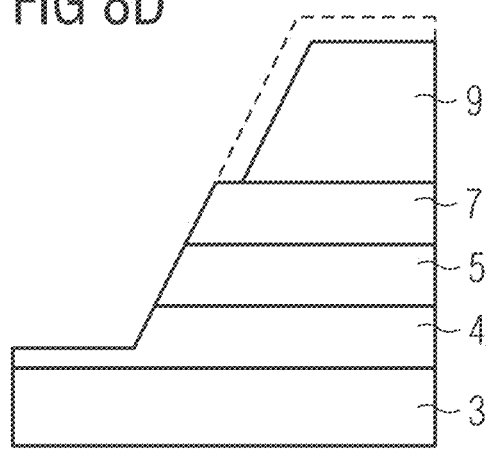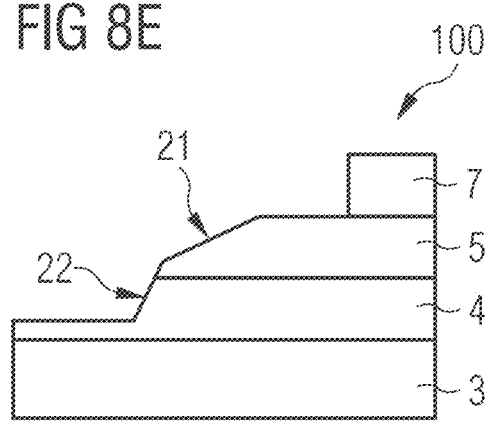

OPTOELECTRONIC SEMICONDUCTOR CHIP AND METHOD FOR FABRICATING AN OPTOELECTRONIC SEMICONDUCTOR CHIP

The invention relates to an optoelectronic semiconductor chip, in particular a radiation-emitting optoelectronic semiconductor chip, such as, for example, an LED chip. The invention further relates to a method for producing an optoelectronic semiconductor chip.

Optoelectronic semiconductor chips generally have an electrical contact with an electrically conductive layer, for example made of ITO, and a semiconductor layer sequence, which is delimited by at least one, in particular two side flanks. The larger the contact area, the lower the voltage contribution and the higher the efficiency of the optoelectronic semiconductor chip. However, if the contact area is selected to be too large, electrically charged or electrically conductive particles reach the open pn-junction of the semiconductor layer sequence. The contact between the charged or electrically conductive particles and the pn-junction results in electrical paths for leakages and leakage currents. These leakages or leakage currents can reduce the efficiency of the optoelectronic semiconductor chip or even lead to failure of the optoelectronic semiconductor chip.

The aim of the invention is to provide an improved optoelectronic semiconductor chip. In particular, an optoelectronic semiconductor chip is to be provided which, on the one hand, prevents leakage or leakage currents and, on the other hand, has an optimum contact area, in particular a p-contact area.

This object is achieved by an optoelectronic semiconductor chip according to independent claim 1. This object is further achieved by a method for producing an optoelectronic semiconductor chip according to independent claim 10. Advantageous embodiments and developments of the invention are the subject matter of the dependent claims.

In at least one embodiment, the optoelectronic semiconductor chip comprises at least one n-doped semiconductor layer, at least one p-doped semiconductor layer and an active layer arranged between the at least one n-doped semiconductor layer and the at least one p-doped semiconductor layer. An electrically conductive layer is arranged above the p-doped semiconductor layer. The electrically conductive layer is designed for electrically contacting the at least one p-doped semiconductor layer. A side flank is arranged laterally to the n-doped semiconductor layer and/or to the p-doped semiconductor layer and/or to the active layer. The side flank has at least two angular partial flanks. The first partial flank is arranged at least in regions or completely laterally with respect to the p-doped semiconductor layer. The second partial flank is arranged at least in regions or completely laterally with respect to the n-doped semiconductor layer. The angle of the first partial flank is flatter than the angle of the second partial flank with respect to the active layer. The electrically conductive layer is laterally spaced from the side flank.

According to at least one embodiment of the optoelectronic semiconductor chip, said semiconductor chip comprises at least one n-doped semiconductor layer and at least one p-doped semiconductor layer. The semiconductor layers or the semiconductor layer sequence of the semiconductor chip are preferably based on a III-V-compound semiconductor material. The semiconductor material is preferably a nitride compound semiconductor material such as $Al_nIn_{1-n-m}Ga_mN$ or else a phosphide compound semiconductor material such as $Al_nIn_{1-n-m}Ga_mP$, wherein in each case $0 \le n \le 1$, $0 \le m \le 1$ and $n+m \le 1$. The semiconductor material can likewise be $Al_xGa_{1-x}As$, where $0 \le x \le 1$. In this case, the semiconductor layer sequence can have dopants and additional constituents. For the sake of simplicity, however, only the essential components of the crystal lattice of the semiconductor layer sequence, i.e. Al, As, Ga, In, N or P, are shown, even if these can be partially replaced and/or supplemented by small quantities of further substances.

The semiconductor layer sequence comprises an active layer having at least one pn-junction and/or having one or more quantum well structures. During operation of the semiconductor chip, an electromagnetic radiation is generated in the active layer. A wavelength of the radiation is preferably in the ultraviolet and/or visible spectral range, in particular between 420 nm and 680 nm inclusive, for example between 440 nm and 480 nm inclusive.

According to at least one embodiment, the optoelectronic semiconductor chip is a light-emitting diode, LED for short. The semiconductor chip is then preferably designed for the purpose of emitting blue light or white light, in particular if the semiconductor chip has a converter element.

According to at least one embodiment, the optoelectronic semiconductor chip has an electrically conductive layer. The electrically conductive layer is designed for electrically contacting the at least one p-doped semiconductor layer. In other words, the electrically conductive layer forms at least a part of the p-type contact of the optoelectronic semiconductor chip. The p-contact can additionally have, for example, a bonding pad and/or one or more contact webs. The electrically conductive layer is arranged above the p-doped semiconductor layer. The term "above the p-doped semiconductor layer" is understood here and below to mean that the electrically conductive layer is arranged directly or indirectly in electrical and/or mechanical contact to the p-doped semiconductor layer. In the case of indirect contact, further layers or further elements, for example a blocking element, can be arranged at least in regions between the p-doped semiconductor layer and the electrically conductive layer.

The electrically conductive layer can be transparent. In particular, the electrically conductive layer is transmissive with respect to the emitted radiation. The electrically conductive layer can cover a comparatively large proportion of the p-doped semiconductor layer. Preferably, the electrically conductive layer covers the predominant part of the p-doped semiconductor layer or is even applied over the whole area to the p-doped semiconductor layer apart from an optional region for one blocking element or on account of the lateral distance of the electrically conductive layer from the side flank. In this way, a good current expansion in the semiconductor layer sequence is achieved. The electrically conductive layer preferably contains a transparent conductive oxide (TCO), such as, for example, ITO.

Transparent, electrically conductive oxides (TCOs) are transparent, electrically conductive materials, generally metal oxides, such as, for example, zinc oxide, tin oxide, cadmium oxide, titanium oxide, indium oxide, indium tin oxide (ITO) or aluminum zinc oxide (AZO). In addition to binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides of the group of TCOs can be present/used. Furthermore, the TCOs do not necessarily correspond to a stoichiometric composition and can also be p-doped or n-doped.

According to at least one embodiment, the electrically conductive layer comprises indium tin oxide (ITO) or consists thereof. Alternatively, the electrically conductive layer consists of or comprises silver. In particular, the electrically conductive layer is formed from ITO if the optoelectronic semiconductor chip is a sapphire chip, that is to say a volume-emitting element. In particular, the electrically conductive layer is formed from silver if the optoelectronic semiconductor chip consists of AlInGaN.

Alternatively, the electrically conductive layer can comprise or consist of gold and/or zinc oxide. In particular, the electrically conductive layer is formed from gold if the semiconductor layer sequence of the semiconductor chip has indium phosphide.

According to at least one embodiment, a side flank is arranged laterally to the n-doped semiconductor layer, p-doped semiconductor layer and/or active layer. In particular, the side flank is laterally spaced from the electrically conductive layer. In other words, the electrically conductive layer has a spatial lateral distance of at least 0.5 µm and/or at most 10 µm to the side flank, in particular between 1 µm and 5 µm, for example 3 µm or 3.5 µm. In this way, leakages or leakage currents can be avoided.

In particular, the electrically conductive layer is arranged laterally and above the side flank with the lateral distance.

According to at least one embodiment, the side flank has at least two or exactly two angular partial flanks. The side flank can also have more than two partial flanks, for example three, four, five or six partial flanks. In particular, the partial flanks have a different angle with respect to the active layer. In other words, a side flank is thus formed with an edge rounding. In particular, the side flank has a diameter which corresponds to twice the layer thickness of the p-doped semiconductor layer. The layer thickness of the p-doped semiconductor layer can be between 10 nm and 300 nm inclusive, in particular between 30 nm and 200 nm inclusive, particularly preferably between 30 nm and 100 nm inclusive.

According to at least one embodiment, the optoelectronic semiconductor chip has exactly two side flanks. In particular, the two side flanks delimit the semiconductor layers and the active layer in cross section. In particular, the two side flanks then have at least two angular partial flanks in each case.

According to at least one embodiment, the side flank forms a side surface of a trench. In particular, the trench is a mesa trench, that is to say a trench which extends at least partially into the n-doped semiconductor layer.

According to at least one embodiment, the first partial flank extends in cross sectional view only in the p-doped semiconductor layer. Alternatively, the first partial flank extends in cross sectional view from the p-doped semiconductor layer via the active layer into the n-doped semiconductor layer.

According to at least one embodiment, the second partial flank extends at least in regions or completely laterally to the p-doped semiconductor layer. In other words, the second partial flank is arranged, as seen in a side view or in cross section, laterally with respect to the p-doped semiconductor layer.

According to at least one embodiment, the second partial flank extends only laterally to the n-doped semiconductor layer, i.e. does not extend over the active layer and/or p-doped semiconductor layer.

According to at least one embodiment, the angle of the first partial flank in relation to the active layer is flatter than the angle of the second partial flank. In particular, the angle of the first partial flank with respect to the active layer is smaller than or equal to 30°, 28°, 25°, 22°, 21°, 19°, 15° or 10°. Alternatively or additionally, the angle of the second partial flank in relation to the active layer is greater than or equal to 50°, 55°, 60°, 65°, 70°, 75°, 80° or 85°. In particular the angle of the second partial flank is 70°+/−2°.

The inventors have recognized that, by means of a lateral distance between the electrically conductive layer and the side flank, on the one hand the creep- or leakage current can be prevented and, on the other hand, the p-contact area can be maximized or optimized in terms of area. This can be achieved in particular by means of the method presented here.

The invention further relates to a method for producing an optoelectronic semiconductor chip. The method for producing an optoelectronic semiconductor chip preferably produces the optoelectronic semiconductor chip described above. This means that all the features disclosed for the method are also disclosed for the optoelectronic semiconductor chip and vice versa.

According to at least one embodiment, the method for producing an optoelectronic semiconductor chip comprises the following steps:
A) Provision of at least one n-doped semiconductor layer, at least one p-doped semiconductor layer and an active layer arranged between the at least one n-doped semiconductor layer and the at least one p-doped semiconductor layer,
B) Applying an electrically conductive layer over the p-doped semiconductor layer,
C) Application of a mask to the electrically conductive layer at least in regions,
D) Formation of the side flank, which extends laterally with respect to the p-doped semiconductor layer, to the n-doped semiconductor layer and/or to the active layer. In particular, step D) has the sub-steps of:
D1) Removal of the electrically conductive layer and at least partial removal of the n-doped semiconductor layer, p-doped semiconductor layer and/or active layer in the regions which are not covered by the mask,
D2) Withdrawal of the mask at least laterally in the direction away from the forming side flank,
D3) Removal of the electrically conductive layer, so that the side flank is laterally spaced from the electrically conductive layer, wherein the side flank has at least two angular partial flanks,
wherein the first partial flank is arranged at least in regions or completely laterally with respect to the p-doped semiconductor layer, wherein the second partial flank is arranged at least in regions or completely laterally with respect to the n-doped semiconductor layer. In particular, the angle of the angular first partial flank in relation to the active layer is flatter than the angle of the angular second partial flank.

According to at least one embodiment, step D1) is carried out dry-chemically by means of a chlorine-containing plasma.

According to at least one embodiment, step D2) is carried out by means of an oxygen-containing plasma.

According to at least one embodiment, step D3) is carried out dry-chemically by means of an argon-containing and/or krypton-containing plasma.

According to at least one embodiment, the method does not comprise any wet-chemical process steps.

According to at least one embodiment, steps D1) to D3) take place in the same machine or apparatus. Alternatively, steps D1) to D3) can also be carried out in different machines or apparatus. For example, step D2), that is to say the treatment by means of oxygen-containing plasma, is carried out in an incineration apparatus. The dry-chemical etching of the semiconductor layers and of the electrically conductive layer can be carried out, for example, in an ICP system (ICP, inductively coupled plasma).

Steps D1) to D3) take place in the same apparatus; however, the process steps can also be carried out one after the other in different process chambers of a cluster system. Process steps A) to D) can be repeated as often as desired. For example, process steps D1) to D3) are repeated at least twice or exactly twice.

According to at least one embodiment, the mask is made of photoresist, silicon dioxide ($SiO_2$) or silicon nitride ($SiN_x$). The masks made of silicon dioxide or silicon nitride are also referred to as hard masks.

Instead of an oxygen-containing plasma, for example in step D2), a fluorine-containing plasma and/or nitrogen-containing plasma can also be used.

In other words, a dry-chemical etching process is first carried out in a method step in which the electrically conductive layer, for example made of ITO or silver, and the side flanks of the semiconductor layer sequence are patterned using a mask, for example a resist mask, with chlorine-containing plasma. Following this first dry-chemical process step, in a further step, for example in the same apparatus, an oxygen-containing plasma can be applied. The mask, for example made of photoresist, is removed by the oxygen-containing plasma. The length of the lacquer withdrawal can be adjusted by means of the duration of the oxygen process. As a result, the surface of the electrically conductive layer in the edge region of the side flank is free of lacquer or masks and thus unprotected. In a further process step, a further dry-chemical etching process can then be carried out to dissolve the electrically conductive layer. Depending on the nature of the material of the electrically conductive layer, chlorine-containing plasmas are again used here, for example for TCO or ITO, or a pure argon plasma, for example for noble metals or for thin TCO layers with a layer thickness of less than 200 nm.

The inventors have recognized that no wet-chemical etching process is required when using the method for producing an optoelectronic semiconductor chip described here. The entire production of the semiconductor chip for producing the trench can be realized with a dry-chemical process step sequence. The region between the electrically conductive layer and the side flank is free of electrically charged or electrically conductive particles on account of the dry-chemical etching process. Furthermore, the electrically conductive layer is steep and smooth at this point. In particular, said region has an angle of less than 50°. In this case, smooth means that the roughness in a plan view of the semiconductor chip is less than 100 nm (e.g. FIG. 3A) comparing with conventional semiconductor chips (e.g. FIG. 3C), which have a roughness of a few 100 nm to μm. In addition, an optimum distance is created by the lateral distance between the electrically conductive layer and the side flank, which on the one hand prevents the leakages or leakage current and on the other hand maximizes the p-contact area. This can be set by means of the duration of the process step (for example of D2), by means of oxygen or chlorine-containing plasma. The lateral distance between the electrically conductive layer and the side flank can be set substantially more reliably and reproducibly using a purely dry chemical process than, for example, by using wet chemical processes. The process sequence of process steps A) to D) results in a characteristic rounding of the side flank. This rounding can be unambiguously identified by means of SEM (scanning electron microscopy). The method described above can thus be unambiguously identified on the basis of the optoelectronic semiconductor chip. Process steps A) to D) realize a rounded side flank, in particular a mesa edge. This rounded side flank can advantageously be easily formed with a passivation layer. The improved adhesion thus protects the pn-junction from external influences and thus improves the aging behavior of the optoelectronic semiconductor chip.

Further advantages, advantageous embodiments and developments will become apparent from the exemplary embodiments described below in conjunction with the figures.

Figure 4B:
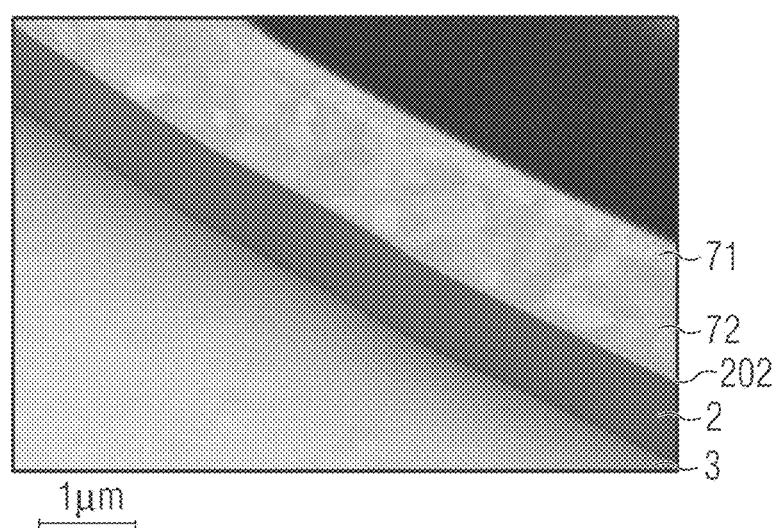
Figure 4C:
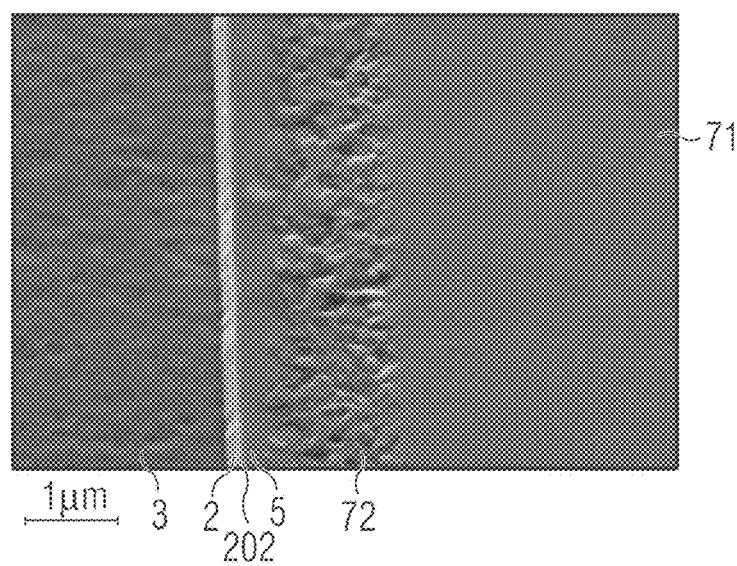

FIG. 1 shows a schematic plan view and side view of an optoelectronic semiconductor chip according to a comparative example, FIGS. 2A to 2C each show a schematic side view of an optoelectronic semiconductor chip according to an embodiment, FIG. 3A shows a schematic side view of an optoelectronic semiconductor chip according to an embodiment, and FIGS. 3B and 3C each show a schematic side view of an optoelectronic semiconductor chip according to a comparative example, FIGS. 4A to 4C each show scanning electron microscopy images of an exemplary embodiment and comparative examples, FIGS. 5 to 7 each show a schematic side view of an optoelectronic semiconductor chip according to an embodiment, and FIGS. 8A to 8E show a method for producing an optoelectronic semiconductor chip according to an embodiment.

In the exemplary embodiments and figures, identical or identically acting elements can in each case be provided with the same reference symbols. The elements illustrated and their size relationships among one another are not to be regarded as true to scale. Rather, individual elements, such as, for example, layers, components, and regions, can be represented with an exaggerated size for better representability and/or for a better understanding. In particular, the side views of the optoelectronic semiconductor chip are only illustrated in sections. The figures show, in particular, only one side flank as a section. However, the optoelectronic semiconductor chip can also have more than one side flank, that is to say further side flanks. In particular, what is specified with respect to the side flank also applies to the further side flanks.

FIG. 1 shows a schematic side view and plan view of an optoelectronic semiconductor chip according to a comparative example. The optoelectronic semiconductor chip has a substrate 1. An n-doped semiconductor layer 3, an active layer 4 and a p-doped semiconductor layer 5 are arranged downstream of the substrate 1. A blocking element 6 is arranged downstream of the p-doped semiconductor layer 5. An electrically conductive layer 7 is arranged downstream of the blocking element 6. The electrically conductive layer 7 is arranged above the p-doped semiconductor layer 5. In general, the electrically conductive layer 7 has a low layer thickness of less than 200 nm. The electrically conductive layer 7 can be formed from silver or ITO, for example. A p-connection contact 8 can be arranged downstream of the electrically conductive layer 7. The electrically conductive layer 7 electrically contacts the p-doped semiconductor layer 5 and the p-type connection contact 8 in an electrically conductive manner. FIG. 1 shows that the electrically conductive layer 7 does not have a lateral distance from the side flank 2 and further side flanks 20 of the optoelectronic semiconductor chip. This can lead to leakages or leakage currents, which reduce the efficiency of the semiconductor chip or lead to failure of the semiconductor chip.

FIGS. 2A to 2C each show a schematic side view of an optoelectronic semiconductor chip 100 according to an embodiment. In FIGS. 2A to 2C, the optoelectronic semiconductor chip 100 has at least one n-doped semiconductor layer 3, at least one p-doped semiconductor layer 5 and an active layer 4 arranged between the at least one p-doped semiconductor layer 5 and the at least one n-doped semiconductor layer 3. An electrically conductive layer, for example made of ITO or silver, is arranged above the p-doped semiconductor layer 5. The electrically conductive layer 7 is designed for electrically contacting the p-doped semiconductor layer 5. The semiconductor chips of FIGS. 2A to 2C each show a lateral distance L of the electrically conductive layer 7 to a side flank 2. In particular, the lateral distance L is between 0.5 µm and 10 µm. In this way, leakage or leakage current can be prevented. In addition, the freely electrically charged or electrically conductive particles do not interfere with the pn-junction of the semiconductor layer sequence. The semiconductor chips of FIGS. 2A to 2C show a side flank 2, but can also have further side flanks (not shown here). The side flank 2 is laterally adjacent to the n-doped semiconductor layer 3, to the p-doped semiconductor layer 5 and to the active layer 4. The side flank 2 can also form a side face of a trench, for example a mesa trench. The side flank 2 has at least one first partial flank 21 and a second partial flank 22. The first partial flank 21 extends at least in regions laterally to the p-doped semiconductor layer 5. The second partial flank 22 extends at least in regions laterally to the n-doped semiconductor layer 3. In particular, the angle of the first partial flank 21 with respect to the active layer 4 is flatter than the angle of the second partial flank 22.

FIGS. 2A to 2C differ in the extension of the respective partial flanks. FIG. 2A shows that the first partial flank 21 extends from the p-doped semiconductor layer 5 via the active layer 4 at least partially into the n-doped semiconductor layer 3. The second partial flank 22 extends exclusively laterally to the n-doped semiconductor layer 3. FIG. 2B shows that the first partial flank 21 extends exclusively in the p-doped semiconductor layer 5 and the second partial flank 22 extends at least in regions from the p-doped semiconductor layer 5 via the active layer 4 into the n-doped semiconductor layer 3. FIG. 2C shows the extent of the first partial flank 21 from the p-doped semiconductor layer 5 into the active layer 4. The second partial flank 22 extends from the active layer 4 into n-doped semiconductor layer 3. In other words, the optoelectronic semiconductor chip 100 of FIG. 2A has an edge 201 in the side flank 2 in the n-doped semiconductor layer 3. The optoelectronic semiconductor chip 100 of FIG. 2B has an edge 201 of the side flank 2 in the p-doped semiconductor layer 5. The optoelectronic semiconductor chip 100 of FIG. 2C has an edge 201 of the side flank 2 in the active layer 4. The optoelectronic semiconductor chips 100 of FIGS. 2A to 2C can have a substrate 1.

FIG. 3A shows a schematic side view of an optoelectronic semiconductor chip according to an embodiment. In this case, FIG. 3A corresponds essentially to FIG. 2B. The optoelectronic semiconductor chip 100 of FIG. 3A was produced by dry chemical etching processes and an oxygen-containing plasma. As a result, the semiconductor chip shows the characteristic lateral distance L, the smooth and sharp edge 203 of the electrically conductive layer 7 and the characteristic side flank 2 with one first angular partial flank 21 and a second angular partial flank 22. This edge 203 has, in particular, an angle of 90°±10% and/or a roughness of less than 100 nm. Thus, on the one hand, leakage and leakage current can be prevented and, on the other hand, the p-contact area can be maximized. The optoelectronic semiconductor chip 100 can be produced reliably and reproducibly.

FIGS. 3B and 3C each show an optoelectronic semiconductor chip 100 according to a comparative example. The optoelectronic semiconductor chip 100 of FIG. 3B has been treated in a dry-chemical manner only once, thus in particular has no method step D3). The electrically conductive layer 7 extends directly on the side flank 2 and subsequently has a height profile which tapers linearly in the direction of the side flank 2. Despite the smooth surface of the electrically conductive layer 7, for example made of ITO, leakages or leakage currents are generated. In other words, in the optoelectronic semiconductor chip 100 of FIG. 3B, the electrically conductive layer 7 extends to the side flank 2, as a result of which leakages or leakage currents are likely in operation.

The optoelectronic semiconductor chip 100 of FIG. 3C was additionally treated wet-chemically. A lateral distance between the electrically conductive layer 7 and the side flank 2 is produced. However, this distance is not a defined safety distance L compared to FIG. 3A, since electrically charged particles can reach the pn-junction of the semiconductor layer sequence. In this case, the lateral distance depends on the etching time and the respective state of the etching solution and is limited overall by the necessary diffusion in the gap between the mask and the semiconductor layer. In addition, the wet-chemically etched electrically conductive layer surface is rough and has a high density of electrically charged particles at the edge 202. This can lead to leakages or leakage currents and thus reduce the efficiency of the component.

Furthermore, the electrically conductive layer 7 can consist of a layer stack, for example of different ITO layers. In this case, different wet-chemical etching rates exist, as a result of which an undefined edge of the electrically conductive layer 7 is produced.

FIGS. 4A to 4C show a microscopic image (SEM) of the optoelectronic semiconductor chips of FIGS. 3A to 3C. The microscopic images are recorded in a plan view of the respective optoelectronic semiconductor chips 100 of FIGS. 3A to 3C. FIG. 4A corresponds to the microscopic images of the semiconductor chip of FIG. 3A, FIG. 4B corresponds to the microscopic images of the semiconductor chip of FIG. 3B, and FIG. 4C corresponds to the microscopic images of the semiconductor chip of FIG. 3C. The reference numerals correspond to the reference numerals in FIGS. 3A to 3C. In comparison to FIGS. 4B and 4C, it can be seen from FIG. 4A that the characteristic structure of the optoelectronic semiconductor chip of FIG. 3A can be recognized and detected by means of scanning electron microscopy. It can be seen from FIG. 4A, in a plan view of the optoelectronic semiconductor chip of FIG. 3A, that the electrically conductive layer 7 has a smooth and sharp demarcation. The lateral distance L is arranged downstream of the electrically conductive layer 7 in a plan view. The first partial flank 21 and the second partial flank 22 are arranged downstream of the lateral distance L. During the transition from the first partial flank 21 into the second partial flank 22, an edge 201 arises.

FIG. 4B shows no lateral distance L between the electrically conductive layer 71, 72 and the side flank 2. The side flank 2 and the electrically conductive layer 71, 72 are separated by an edge 202.

It can be seen from FIG. 4C that the electrically conductive layer 72 is roughened. The edge 202 extends between the p-doped semiconductor layer 5 and the side flank 2.

FIG. 5 shows a schematic side view of an optoelectronic semiconductor chip 100 according to an embodiment. The optoelectronic semiconductor chip 100 comprises an n-doped semiconductor layer 3, an active layer 4 and subsequently a p-doped semiconductor layer 5. The semiconductor chip 100 has an electrically conductive layer 7, for example made of ITO. A lateral distance L is arranged between the electrically conductive layer 7 and the side flank 2. The lateral distance L serves as a so-called safety distance in order to prevent leakage and leakage currents. The side flank 2 has a first partial flank 21, which extends into the p-doped semiconductor layer 5, and a second partial flank 22, which extends from the p-doped semiconductor layer 5 into the n-doped semiconductor layer 3 via the active layer 4.

FIG. 6 shows a schematic side view of an optoelectronic semiconductor chip 100 according to an embodiment. The optoelectronic semiconductor chip 100 of FIG. 6 differs from the optoelectronic semiconductor chip 100 of FIG. 5 in that it has more than two partial flanks. Three partial flanks 21, 22 and 23 are shown here. However, more than three partial flanks can also be present in the optoelectronic semiconductor chip 100. The first partial flank 21 extends exclusively in the p-doped semiconductor layer 5. The second partial flank 22 extends from the p-doped semiconductor layer 5 via the active layer 4 into the n-doped semiconductor layer 3. The third partial flank 23 extends exclusively in the p-doped semiconductor layer 5. The angle in relation to the active layer 4 of the first partial flank 21 is flatter than the angle of the third partial flank 23 and the angle of the second partial flank 22. The second partial flank 22 has the greatest angle with respect to the other partial flanks 21, 23.

The structure of said semiconductor chip was produced in that the process steps having an oxygen-containing plasma process and a dry-chemical etching process have been repeated twice in succession. The electrically conductive layer 7 has a safety distance or a lateral distance L from the side flank 2. In particular, the lateral distance L is 2 to 5 μm, for example 3 μm.

FIG. 7 shows a schematic side view of an optoelectronic semiconductor chip according to an embodiment. FIG. 7 shows that the side flank 2 has a rounded portion. This rounding can easily be mantled with a passivation layer 81. The electrically conductive layer has a lateral distance from the side flank 2. In particular, the side flank 2 is formed as a truncated pyramid-like side flank. The side flank 2 can form said edge rounding, which has a diameter which corresponds to twice the layer thickness of the p-doped semiconductor layer 5.

Figure 8A:
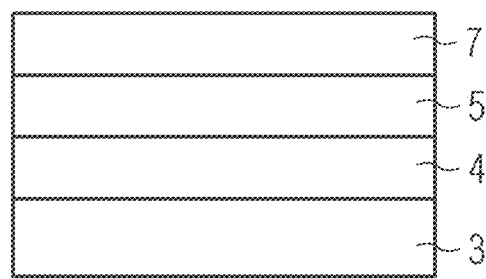
Figure 8B:
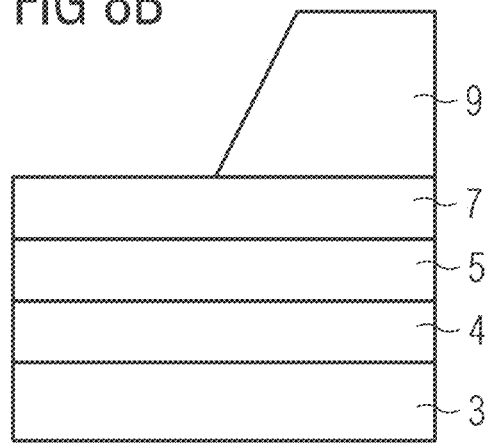
Figure 8C:
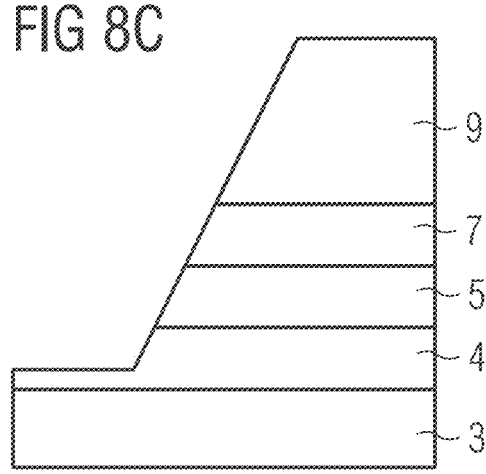

FIGS. 8A to 8C show a method for producing an optoelectronic semiconductor chip according to an embodiment. FIG. 8A shows the provision of an n-doped semiconductor layer 3, of a p-doped semiconductor layer 5, an active layer 4 and an electrically conductive layer 7. Subsequently, a mask 9 is applied to the electrically conductive layer 7 at least in regions (FIG. 8B). Subsequently, the side flank 2 is formed, which extends laterally to the n-doped semiconductor layer 3, to the p-doped semiconductor layer 5 and to the active layer 4. In this case, first in step D1) the electrically conductive layer 7 is deleted at least partially from the n-doped semiconductor layer 3, the p-doped semiconductor layer 5 and the active layer 4 in the regions which are not covered by the mask 9 (FIG. 8C). Subsequently, the mask 9 is pulled back at least laterally in the direction away from the forming side flank 2 (FIG. 8D). The electrically conductive layer 7 is removed, so that the side flank 2 is laterally spaced from the electrically conductive layer 7. In this case, the side flank 2 has at least one first partial flank 21 and a second partial flank 22. In this case, oblique or angular means that the partial flanks have an angle not equal to 90°. In particular, the angle of the first angular partial flank 21 in relation to the active layer is flatter than the angle of the second angular partial flank 22. The electrically conductive layer 7 in FIG. 8C is removed in particular by means of a chlorine-containing plasma or argon-containing plasma. The withdrawal of the mask in process step D2) is carried out by means of an oxygen-containing plasma. The process steps of FIGS. 8A to 8E can be carried out in one and the same apparatus or in different apparatus. The result is an optoelectronic semiconductor chip 100 as illustrated in FIG. 8E. The optoelectronic semiconductor chip of FIG. 8E corresponds substantially to the semiconductor chip 100 of FIG. 2B.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

This patent application claims the priority of German patent application 10 2015 117 662. 9, the disclosure content of which is hereby incorporated by reference.

LIST OF REFERENCE NUMERALS 1 support or substrate
2 side flank
21 first partial flank
22 second partial flank
3 n-doped semiconductor layer
4 active layer
5 p-doped semiconductor layer
6 blocking element
7 electrically conductive layer
81 passivation layer
9 mask
201 edge
202 edge
203 edge
L lateral distance
20 further side flank
100 optoelectronic semiconductor chip
71 region of the electrically conductive layer 7
72 region of the electrically conductive layer 7

The invention claimed is:
1. An optoelectronic semiconductor chip, comprising:
at least one n-doped semiconductor layer,
at least one p-doped semiconductor layer and an active layer arranged between the at least one n-doped semiconductor layer and the at least one p-doped semiconductor layer,
wherein an electrically conductive layer is arranged above the p-doped semiconductor layer, wherein the electrically conductive layer is designed for electrically contacting the p-doped semiconductor layer,
wherein, laterally to the n-doped semiconductor layer, the p-doped semiconductor layer and to the active layer, a side flank is arranged, wherein the side flank comprises at least two angular partial flanks, wherein a first partial flank is arranged at least in regions laterally with respect to the p-doped semiconductor layer, wherein a second partial flank is arranged at least in regions laterally with respect to the n-doped semiconductor layer, wherein an angle of the first partial flank with respect to the active layer is flatter than an angle of the second partial flank, wherein the electrically conductive layer is laterally spaced from the side flank, and wherein the first partial flank extends in cross section only in the p-doped semiconductor layer.

2. The optoelectronic semiconductor chip according to claim 1, wherein the lateral distance (L) of the electrically conductive layer to the side flank is between 0.5 µm and 10 µm.

3. The optoelectronic semiconductor chip according to claim 1, wherein the angle of the first partial flank with respect to the active layer is less than 30°.

4. The optoelectronic semiconductor chip according to claim 1, wherein the angle of the second partial flank relative to the active layer is greater than 50°.

5. The optoelectronic semiconductor chip according to claim 1, wherein the side flank has more than two angular partial flanks having different angles with respect to the active layer, such that the side flank forms an edge rounding, which has a diameter, wherein the diameter corresponds to twice the layer thickness of the p-doped semiconductor layer.

6. The optoelectronic semiconductor chip according to claim 1, wherein the side flank is a side surface of a trench, which extends at least partially into the n-doped semiconductor layer.

7. The optoelectronic semiconductor chip according to claim 1, wherein the electrically conductive layer is made of indium tin oxide, gold, zinc oxide or silver.

8. The optoelectronic semiconductor chip according to claim 1, wherein the first partial flank extends in cross section from the p-doped semiconductor layer via the active layer into the n-doped semiconductor layer.

9. A method for producing an optoelectronic semiconductor chip comprising the steps of:
A) Providing at least one n-doped semiconductor layer, at least one p-doped semiconductor layer and an active layer, which is arranged between the at least one n-doped semiconductor layer and the at least one p-doped semiconductor layer,
B) Applying an electrically conductive layer over the p-doped semiconductor layer,
C) Applying a mask at least in regions to the electrically conductive layer,
D) Forming the side flank, which extends laterally with respect to the n-doped semiconductor layer, to the p-doped semiconductor layer and to the active layer, with the partial steps of:
D1) Removal of the electrically conductive layer and at least partially of the n-doped semiconductor layer, p-doped semiconductor layer and active layer in the regions which are not covered by the mask,
D2) Withdrawal of the mask at least laterally in the direction away from the forming side flank,
3) Removal of the electrically conductive layer, such that the side flank is laterally spaced from the electrically conductive layer, wherein the side flank has at least two angular partial flanks, wherein the first partial flank is arranged at least in regions laterally with respect to the p-doped semiconductor layer, wherein the second partial flank is arranged at least in regions laterally with respect to the n-doped semiconductor layer, wherein the angle of the first partial flank with respect to the active layer is flatter than the angle of the second partial flank.

10. The method according to claim 9, wherein step D1) is produced dry-chemically by means of a chlorine-containing plasma.

11. The method according to claim 9, wherein step D2) is produced by means of an oxygen-containing, nitrogen-containing or fluorine-containing plasma.

12. The method according to claim 9, wherein step D3) is produced dry-chemically by means of an argon-containing or krypton-containing plasma.

13. The method according to claim 9, Wherein steps D1) to D3) are carried out in the same machine.

14. The method according to claim 9, wherein the mask is made of photoresist, silicon dioxide or silicon nitride.

15. An optoelectronic semiconductor chip, comprising:
at least one n-doped semiconductor layer,
at least one p-doped semiconductor layer and
an active layer arranged between the at least one n-doped semiconductor layer and the at least one p-doped semiconductor layer,
wherein an electrically conductive layer is arranged above the p-doped semiconductor layer, wherein the electrically conductive layer is designed for electrically contacting the p-doped semiconductor layer,
wherein, laterally to the n-doped semiconductor layer, the p-doped semiconductor layer and to the active layer, a side flank is arranged, wherein the side flank comprises at least two angular partial flanks, wherein a first partial flank is arranged at least in regions laterally with respect to the p-doped semiconductor layer, wherein a second partial flank is arranged at least in regions laterally with respect to the n-doped semiconductor layer, wherein an angle of the first partial flank with respect to the active layer is flatter than an angle of the second partial flank, wherein the electrically conductive layer is laterally spaced from the side flank, and wherein the semiconductor chip tapers from the n-doped semiconductor layer towards the p-doped semiconductor layer.

* * * * *